(12) United States Patent
Honda et al.

(10) Patent No.: US 6,709,753 B2
(45) Date of Patent: Mar. 23, 2004

(54) SILICONE-MODIFIED EPOXY OR PHENOLIC RESIN COMPOSITIONS AND SEMICONDUCTOR DEVICES SEALED THEREWITH

(75) Inventors: Tsuyoshi Honda, Gunma-ken (JP); Toshio Shiobara, Gunma-ken (JP); Tatsuya Kanamaru, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 1 day.

(21) Appl. No.: 10/079,495

(22) Filed: Feb. 22, 2002

(65) Prior Publication Data

US 2002/0192477 A1 Dec. 19, 2002

(30) Foreign Application Priority Data

Feb. 23, 2001 (JP) ........................................ 2001-048285

(51) Int. Cl.$^7$ ..................... B32B 27/42; B32B 27/38; H01L 21/56; C08L 83/04
(52) U.S. Cl. ..................... 428/447; 428/413; 438/780; 525/474; 525/476; 525/477; 525/478; 525/523; 525/524; 525/525; 525/534
(58) Field of Search ................................. 525/474, 475, 525/476, 477, 478, 523, 524, 525, 534; 528/33, 87, 106, 86; 428/413, 446, 447; 438/127, 758, 780

(56) References Cited

U.S. PATENT DOCUMENTS 5,965,637 A * 10/1999 Pfander et al. ............. 523/440

FOREIGN PATENT DOCUMENTS

| JP | 61-48544 | 10/1986 |
|---|---|---|
| JP | 62-36050 | 8/1987 |
| JP | 63-63807 | 12/1988 |

* cited by examiner

Primary Examiner—Robert Dawson
Assistant Examiner—Michael J Feely
(74) Attorney, Agent, or Firm—Birch, Stewart, Kolasch & Birch, LLP

(57) ABSTRACT

A resin composition is provided comprising a silicone-modified epoxy or phenolic resin obtained by reacting an epoxy or phenolic resin having specific structural units with an organopolysiloxane. The modified epoxy or phenolic resin is such that after the modified epoxy or phenolic resin is cured alone or together with another epoxy resin and/or phenolic resin to form a cured product, the organopolysiloxane component does not form a phase separation structure in the cured product. The composition cures into a product having both the adherence, heat resistance and humidity resistance characteristic of epoxy or phenolic resins and the flexibility and impact resistance characteristic of silicone resins.

15 Claims, No Drawings

SILICONE-MODIFIED EPOXY OR PHENOLIC RESIN COMPOSITIONS AND SEMICONDUCTOR DEVICES SEALED THEREWITH

This invention relates to silicone-modified epoxy or phenolic resin compositions which cure into products having both the flexible and impact resistant properties of silicone resins and the adherent, heat resistant and humidity resistant properties of epoxy or phenolic resins. It also relates to semiconductor devices coated or sealed with the cured product of the resin compositions.

BACKGROUND OF THE INVENTION

Epoxy resins and phenolic resins have good adhesion, heat resistance and humidity resistance and find use in a wide variety of applications including adhesives and paints, and recently in advanced applications such as encapsulants for semiconductor devices. However, these resins have the drawbacks of being rigid and brittle and cannot be used in hostile environments as encountered in automobiles and aircraft.

To date, extensive efforts have been made to make flexible cured products of epoxy resins and phenolic resins. For example, the inventors proposed the use of modified epoxy or phenolic resins which have been reacted with silicone (see JP-B 61-48544, JP-B 62-36050, JP-B 63-63807). This approach is to control the compatibility between an epoxy or phenolic resin as the main component and a silicon as the modifying component so as to form a phase separation structure. If the phase separation structure is an adequate microstructure, it serves to absorb impacts, contributing to improvements in the flexibility and strength of cured resin. However, this approach is among the concept of stress reduction and does not reach the flexibility level of silicone resins.

On the other hand, silicone resins achieve levels of adhesion, heat resistance and humidity resistance which are far below those of epoxy and phenolic resins.

SUMMARY OF THE INVENTION

Therefore, an object of the invention is to provide a resin composition comprising a silicone-modified epoxy or phenolic resin which cures into a product having both the adherence, heat resistance and humidity resistance characteristic of epoxy resins or phenolic resins and the flexibility and impact resistance characteristic of silicone resins. Another object is to provide a semiconductor device coated or sealed with the cured product of the resin composition.

We have found that a satisfactory silicone-modified epoxy resin or silicone-modified phenolic resin is obtained by reacting an epoxy resin or phenolic resin having in a molecule at least two structural units of the following formula (1) with an organopolysiloxane having the following average compositional formula (2). The modified epoxy or phenolic resin is such that after the modified epoxy or phenolic resin is cured alone to form a cured product or after the modified epoxy or phenolic resin is added to another epoxy resin and/or phenolic resin and cured together to form a cured product, the organopolysiloxane component does not form a phase separation structure in the cured product.

This modified epoxy or phenolic resin cures into a product having both the adherence, heat resistance and humidity resistance characteristic of epoxy resins or phenolic resins and the flexibility and impact resistance characteristic of silicone resins.

Specifically, the invention provides a resin composition comprising a silicone-modified epoxy resin or silicone-modified phenolic resin obtained by reacting an epoxy resin or phenolic resin having in a molecule at least two structural units of the following formula (1) with an organopolysiloxane having the following average compositional formula (2), the modified epoxy or phenolic resin being such that after the modified epoxy or phenolic resin is cured alone to form a cured product or after the modified epoxy or phenolic resin is added to another epoxy resin and/or phenolic resin and cured together to form a cured product, the organopolysiloxane component does not form a phase separation structure in the cured product.

Herein $R^3$ is hydrogen or glycidyl and $R^4$ is hydrogen or a monovalent hydrocarbon group having 1 to 6 carbon atoms.

$$(R^1)_a(R^2)_b SiO_{(4-a-b)/2} \tag{2}$$

Herein $R^1$ is selected from the class consisting of a hydrogen atom, a hydroxyl group, an alkoxy group, an alkenyloxy group, and a monovalent organic group containing an amino, epoxy, hydroxyl or carboxyl group, $R^2$ is a substituted or unsubstituted monovalent hydrocarbon group, letters a and b are positive numbers satisfying $0.001 \leq a \leq 1$, $1 \leq b \leq 2.5$ and $1 \leq a+b \leq 3$, the number of silicon atoms in a molecule is an integer of 2 to 1,000, and the number of functional groups $R^1$ directly attached to silicon atoms in a molecule is an integer of at least 1.

The invention also provides a semiconductor device comprising a semiconductor chip whose surface is coated or sealed with the resin composition in the cured state.

DESCRIPTION OF THE PREFERRED EMBODIMENTS

The silicone-modified epoxy resin or silicone-modified phenolic resin used herein is obtained by reacting an epoxy resin or phenolic resin having in a molecule at least two, preferably 2 to 10, and more preferably 2 to 5, structural units of the formula (1) with an organopolysiloxane having the average compositional formula (2).

The epoxy resin or phenolic resin serving as a raw material for the silicone-modified resin should have at least two structural units of the following formula (1) in a molecule.

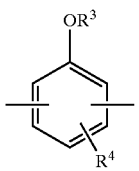
(1)

Herein $R^3$ is hydrogen or a glycidyl group represented by

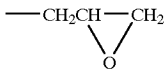

and $R^4$ is hydrogen or a monovalent hydrocarbon group having 1 to 6 carbon atoms.

The monovalent hydrocarbon groups represented by $R^4$ are those of 1 to 6 carbon atoms, preferably 1 to 3 carbon atoms, for example, alkyl groups such as methyl, ethyl, n-propyl, isopropyl, n-butyl, isobutyl, tert-butyl, pentyl, neopentyl, hexyl and cyclohexyl, alkenyl groups such as vinyl, allyl, propenyl and butenyl, aryl groups such as phenyl. Also included are halo-substituted monovalent hydrocarbon groups in which some or all of the hydrogen atoms on the foregoing hydrocarbon groups are substituted with halogen atoms.

At least two structural units of formula (1) should be included for the following reason. When the epoxy or phenolic resin is reacted with an organopolysiloxane, either one of $R^3$ and $R^4$ in formula (1) reacts with functional groups $R^1$ in formula (2). If only one structural unit of formula (1) is included and $R^3$ reacts with the functional group $R^1$, then the epoxy group or phenolic hydroxyl group is eliminated from the site of formula (1), and so the resin loses the function of epoxy or phenolic resin. If only one structural unit of formula (1) is included and $R^4$ reacts with the functional group $R^1$, the resulting reaction product has both an epoxy or phenolic hydroxyl group and an organopolysiloxane attached to a common benzene ring so that reactivity lowers due to the steric factor. In contrast, in the event where two or more structural units of formula (1) are included, if the ratio of the epoxy or phenolic resin and the organopolysiloxane blended is controlled, there is a possibility that either one of the epoxy or phenolic hydroxyl group and the organopolysiloxane be present on some benzene rings, that is, a possibility to maintain reactivity. As compared with the inclusion of one structural unit of formula (1), the inclusion of two or more structural units of formula (1) leads to a silicone-modified resin having an increased number of functional groups, resulting in a cured product having an increased crosslinking density and hence, improved mechanical strength, heat resistance and humidity resistance.

Of the epoxy resins and phenolic resins described above, those of the following formulae (3), (4) and (5) are desirable.

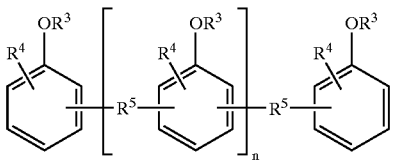
(3)

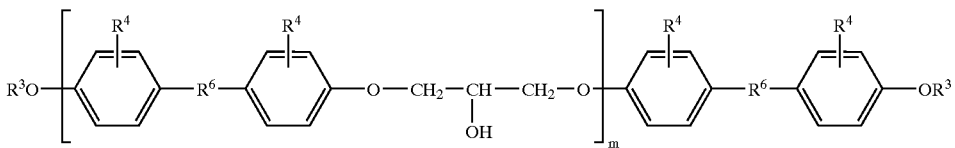
(4)

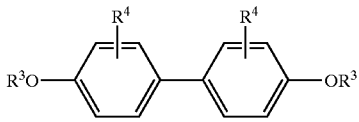
(5)

Herein $R^3$ is hydrogen or glycidyl:

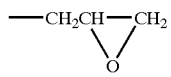

$R^4$ is hydrogen or a monovalent hydrocarbon group having 1 to 6 carbon atoms, $R^5$ is —CH$_2$— or

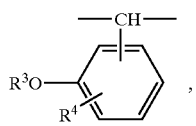
, $R^6$ is
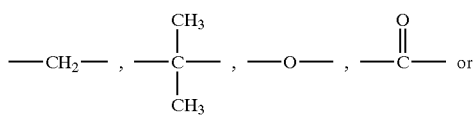 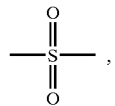
letters n and m are integers of at least 0.
Illustrative examples of the epoxy resins and phenolic resins of the formulae (3), (4) and (5) are compounds of the following structures.
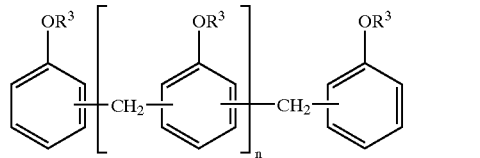 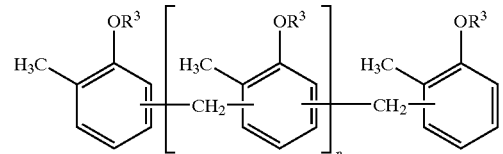
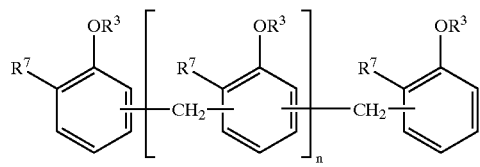 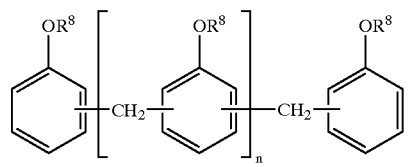
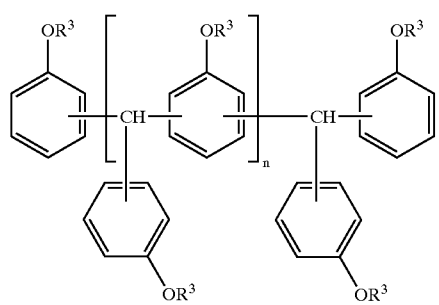 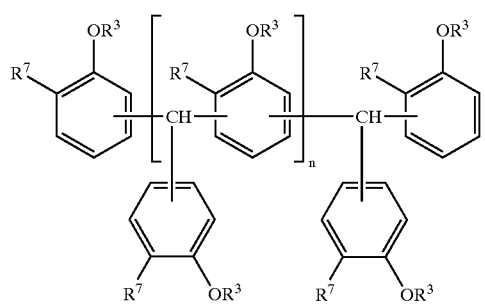
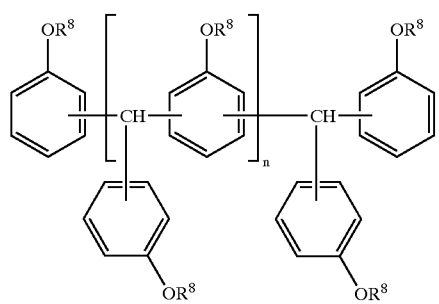
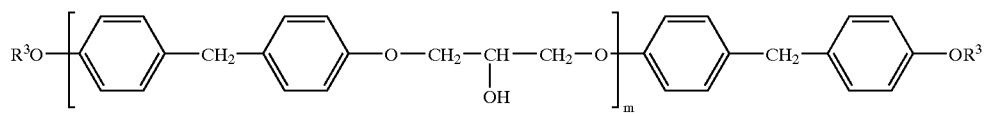
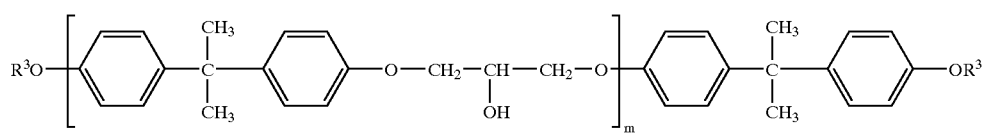
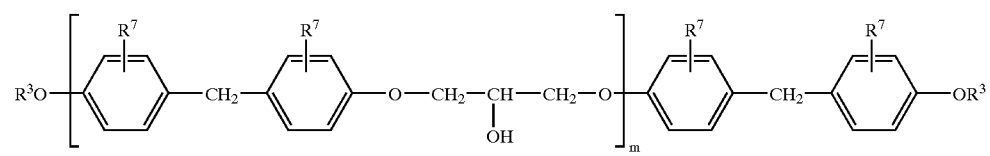

-continued

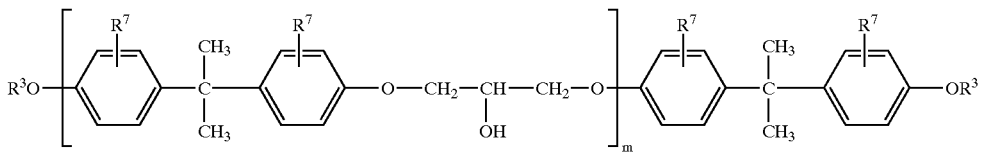

Herein $R^3$ is hydrogen or glycidyl:

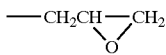

$R^7$, which may be the same or different, is hydrogen or an alkenyl group such as vinyl, allyl or propenyl, $R^8$, which may be the same or different, is

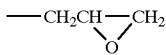

or

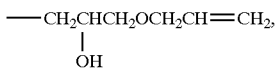

letters n and m are integers of at least 0.

The molecular weight of the epoxy and phenolic resins is not critical although a lower molecular weight is desired for reducing the viscosity of silicone-modified resins and improving the processing of resin compositions. Specifically, it is desired that m is 0 to 5 and n is 0 to 10, and more desirably, m is 0 to 3 and n is 0 to 5 in the event where $R^5$ is $-CH_2-$, or n is 0 to 3 in the event where $R^5$ is

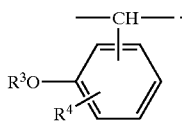

Another raw material for the silicone-modified resin used herein is an organopolysiloxane having the following average compositional formula (2).

$$(R^1)_a(R^2)_b SiO_{(4-a-b)/2} \quad (2)$$

Herein $R^1$ is a hydrogen atom, a hydroxyl group, an alkoxy group, an alkenyloxy group or a monovalent organic group containing an amino, epoxy, hydroxyl or carboxyl group. $R^2$ is a substituted or unsubstituted monovalent hydrocarbon group. Letters a and b are positive numbers satisfying $0.001 \leq a \leq 1$, $1 \leq b \leq 2.5$ and $1 \leq a+b \leq 3$. The number of silicon atoms in a molecule is an integer of 2 to 1,000, and the number of functional groups $R^1$ directly attached to silicon atoms in a molecule is an integer of at least 1.

The amino-containing monovalent organic groups represented by $R^1$ include alkyl groups having an amino or N-substituted amino group substituted thereon, as exemplified below.

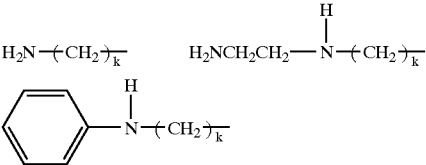

Herein k is 1, 2 or 3.

The epoxy-containing monovalent organic groups represented by $R^1$ include alkyl groups having a glycidyloxy or 3,4-epoxycyclohexyl group substituted thereon, as exemplified below.

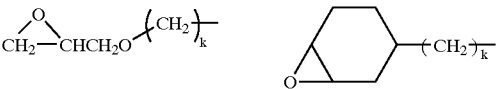

Herein k is 1, 2 or 3.

The hydroxyl-containing monovalent organic groups represented by $R^1$ include alkyl groups having a hydroxyl or hydroxyphenyl group substituted thereon, as exemplified below.

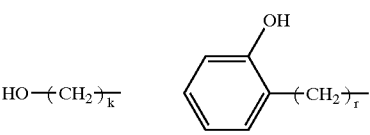

Herein k is 1, 2 or 3 and r is 0, 1, 2 or 3.

The carboxyl-containing monovalent organic groups represented by $R^1$ include terminally carboxyl-substituted alkyl groups, as exemplified below.

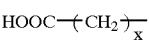

Herein x is an integer of 0 to 10.

In addition to the substituted organic groups mentioned above, the functional groups $R^1$ are hydrogen, hydroxyl, alkoxy and alkenyloxy groups. Of these, the hydrogen atom and hydroxyl group bond with a silicon atom to form a hydrosilyl (SiH) group and silanol (SiOH) group, respectively.

Of the alkoxy groups, those having 1 to 8 carbon atoms, especially 1 to 4 carbon atoms are preferred. Examples include straight, branched and cyclic alkoxy groups such as methoxy, ethoxy, iso-propoxy, n-propoxy, sec-propoxy, n-butoxy, sec-butoxy, iso-butoxy, tert-butoxy, n-pentyloxy, sec-pentyloxy, cyclopentyloxy, n-hexyloxy, and cyclohexyloxy. Preferred alkoxy groups are of the following formula.

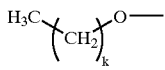

Herein k is 1, 2 or 3.

Of the alkenyloxy groups, those having 2 to 6 carbon atoms, especially 2 to 4 carbon atoms are preferred. Exemplary alkenyloxy groups include vinyloxy, propenyloxy, isopropenyloxy and isobutenyloxy.

$R^2$ stands for substituted or unsubstituted monovalent hydrocarbon groups, preferably having 1 to 10 carbon atoms, especially 1 to 6 carbon atoms, for example, alkyl groups such as methyl, ethyl, n-propyl, isopropyl, n-butyl, isobutyl, tert-butyl, pentyl, neopentyl, hexyl, cyclohexyl, octyl and decyl; alkenyl groups such as vinyl, allyl, propenyl and butenyl; aryl groups such as phenyl and tolyl; and aralkyl groups such as benzyl and phenylethyl. Also included are halo-substituted monovalent hydrocarbon groups in which some or all of the hydrogen atoms on the foregoing hydrocarbon groups are substituted with halogen atoms.

Letters a and b are positive numbers satisfying $0.001 \leq a \leq 1$, $1 \leq b \leq 2.5$ and $1 \leq a+b \leq 3$, and preferably $0.01 \leq a \leq 0.1$, $1.8 \leq b \leq 2$ and $1.85 \leq a+b \leq 2.1$. The number of silicon atoms in a molecule is an integer of 2 to 1,000, preferably 2 to 100, and more preferably 5 to 60. The number of functional groups $R^1$ directly attached to silicon atoms in a molecule is an integer of at least 1, preferably 2 to 5, and most preferably 2.

Illustrative of the organopolysiloxane are organohydrogenpolysiloxanes of the following formula (6), and organopolysiloxanes containing amino, epoxy, hydroxyl or carboxyl groups of the following formula (7).

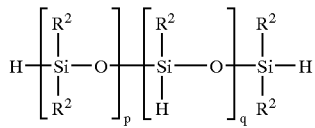

(6)

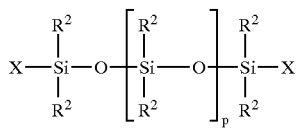

(7)

In formulae (6) and (7), $R^2$ is a substituted or unsubstituted monovalent hydrocarbon group like $R^2$ in formula (3), preferably a methyl or phenyl group; X is typically a monovalent hydrocarbon group containing an amino, epoxy, hydroxyl or carboxyl group, examples of which are the same as exemplified for $R^1$ in formula (2). Letter p is desirably an integer of 0 to 98, especially 3 to 58, and q is desirably an integer of 0 to 20, especially 0 to 5.

Illustrative of the compounds of formulae (6) and (7) are the organopolysiloxanes shown below. It is noted that the number of recurring siloxane units in each formula is merely exemplary while it can be an arbitrary integer within the range corresponding to the above ranges of p and q.

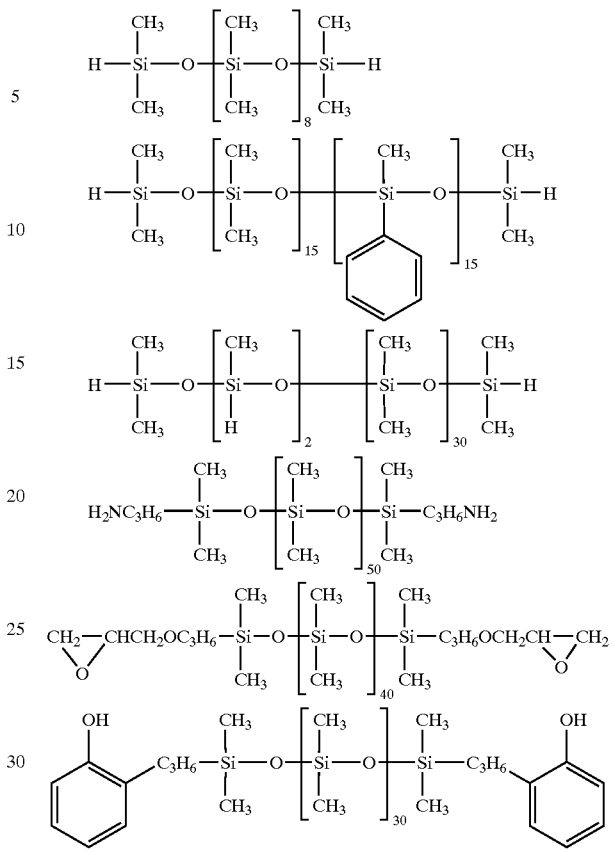

These organopolysiloxanes desirably have a molecular weight of 100 to 10,000 and especially 500 to 5,000, though not limited thereto. When the organopolysiloxane has a molecular weight in this range, a cured product of an epoxy or phenolic resin modified therewith does not undergo phase separation and remains uniform and thus possesses both the properties of silicone resins featuring flexibility and impact resistance and the properties of epoxy or phenolic resins featuring adherence, heat resistance and humidity resistance. The cured product may become rigid and brittle if the molecular weight is less than 100. Phase separation can occur if the molecular weight is more than 10,000.

The organopolysiloxane is desirably used in such an amount that the content of the organopolysiloxane component in the silicone-modified resin may be up to 80% by weight, although the amount of the organopolysiloxane used is not critical.

Any of well-known methods may be used in obtaining the silicone-modified epoxy or phenolic resin. Preferably the modified resin is obtained by effecting hydrosilylation addition reaction between alkenyl groups in the alkenyl group-containing epoxy resin or alkenyl group-containing phenolic resin and SiH group(s) in the organopolysiloxane having at least one hydrogen atom attached to a silicon atom (SiH group), i.e., organohydrogenpolysiloxane.

The resin composition of the invention requires that the organopolysiloxane component do not form a phase separation structure in the cured product, that is, the cured product be uniform. The factors that govern phase separation include the content of the organopolysiloxane component in the silicone-modified resin (specifically silicone-modified epoxy resin or silicone-modified phenolic resin), and the content of the organopolysiloxane component in the entire organic resin components (i.e., silicone-modified epoxy resin, silicone-modified phenolic resin and optional epoxy resin and/or phenolic resin to be described later, together) in the resin composition.

The content of the organopolysiloxane component in the silicone-modified epoxy resin or silicone-modified phenolic resin is desirably up to 80% and especially up to 70% by weight. If this content is more than 80% by weight, the organopolysiloxane component may form a phase separation structure in the silicone-modified resin, which becomes heterogeneous. If this silicone-modified resin is included in a resin composition, the organopolysiloxane component may still form a phase separation structure in the resin composition, which becomes heterogeneous. As a result, the flexibility and impact resistance characteristic of silicone resins are maintained due to the increased content of the organopolysiloxane component, but the adherence, heat resistance and humidity resistance characteristic of epoxy or phenolic resins are lost. The lower limit of the organopolysiloxane component content is preferably at least 10%, more preferably at least 20%, and even more preferably at least 30% by weight, thought not critical. If the content of the organopolysiloxane component is too low, it may become difficult to control the content of the organopolysiloxane component in the entire organic resin components to fall in an appropriate range.

The content of the organopolysiloxane component in the entire organic resin components (i.e., silicone-modified epoxy resin, silicone-modified phenolic resin and optional epoxy resin and/or phenolic resin to be described later, together) in the resin composition is preferably at least 10%, more preferably at least 20%, and even more preferably at least 30% by weight. If this content is less than 10% by weight, the organopolysiloxane component may form a phase separation structure in the resin composition, which becomes heterogeneous. As a result, the adherence, heat resistance and humidity resistance characteristic of epoxy or phenolic resins are maintained due to the reduced content of the organopolysiloxane component, but the cured product becomes rigid and brittle and loses the flexibility and impact resistance characteristic of silicone resins. The upper limit of the organopolysiloxane component content in the entire organic resin components is preferably up to 80% by weight for the same reason as described for the content of the organopolysiloxane component in the silicone-modified resin, though not critical.

No particular limits are imposed on the viscosity and epoxy equivalent of the silicone-modified epoxy resin or the viscosity and phenolic hydroxyl equivalent of the silicone-modified phenolic resin. Depending on a particular application, the modified resin may have any desired viscosity ranging from liquid to solid at room temperature. For resin compositions which are liquid at room temperature, the silicone-modified epoxy resin should preferably have a viscosity of 0.01 to 100 Pa·s at 25° C., especially 0.1 to 20 Pa·s at 25° C., and an epoxy equivalent of 100 to 2,000, especially 200 to 1,000. Similarly for liquid resin compositions, the silicone-modified phenolic resin should preferably have a viscosity of 0.01 to 200 Pa·s at 25° C., especially 0.1 to 100 Pa·s at 25° C., and a phenolic hydroxyl equivalent of 100 to 2,000, especially 200 to 1,000.

In the resin composition, it is preferred to use a mixture of the silicone-modified epoxy resin and the silicone-modified phenolic resin.

The amounts of the silicone-modified epoxy resin and the silicone-modified phenolic resin blended in the resin composition are not critical. Desirably, these modified resins are desirably blended in such a proportion that the content of the organopolysiloxane component in the entire organic resin components (i.e., silicone-modified epoxy resin, silicone-modified phenolic resin and optional epoxy resin and/or phenolic resin to be described later, together) in the resin composition may be at least 10% by weight. The cured product may become rigid and brittle if the organopolysiloxane component content is less than 10% by weight.

In the resin composition, any of well-known epoxy and phenolic resins may be included in addition to the silicone-modified resin.

The epoxy resin used herein is not critical with respect to molecular structure and molecular weight as long as it has at least two epoxy groups in a molecule. Any of conventional well-known epoxy resins may be used. Illustrative examples of useful epoxy resins include bisphenol-type epoxy resins such as bisphenol A epoxy resin and bisphenol F epoxy resin, novolac-type epoxy resins such as phenolic novolac epoxy resin and cresol novolac epoxy resin, triphenolalkane-type epoxy resins and polymers thereof such as triphenolmethane epoxy resin and triphenolpropane epoxy resin, epoxy resins having a biphenyl skeleton, epoxy resins having a naphthalene skeleton, dicyclopentadiene-phenol novolac resins, phenolaralkyl type epoxy resins, glycidyl ester type epoxy resins, alicyclic epoxy resins, heterocyclic epoxy resins, and halogenated epoxy resins. These epoxy resins may be used singly or as mixtures of two or more thereof.

The phenolic resin used herein is preferably selected from phenolic resins having at least two phenolic hydroxyl groups in a molecule. Illustrative examples include bisphenol type resins such as bisphenol A resin and bisphenol F resin, novolac resins such as phenol novolac resin and cresol novolac resin, triphenolalkane type resins such as triphenolmethane resin and triphenolpropane resin, resole type phenolic resins, phenol aralkyl resins, biphenyl type phenolic resins, naphthalene type phenolic resins, and cyclopentadiene type phenolic resins. These phenolic resins may be used singly or as mixtures of two or more thereof.

The amounts of the epoxy resin and phenolic resin blended are determined in consideration of the silicone-modified resin. The resins are preferably blended such that the molar ratio of epoxy groups in the silicone-modified epoxy resin and the epoxy resin to phenolic hydroxyl groups in the silicone-modified phenolic resin and the phenolic resin may fall in the range: $0.8 \leq$ (epoxy groups)/(phenolic hydroxyl groups)$\leq 1.25$, and especially $0.9 \leq$ (epoxy groups)/(phenolic hydroxyl groups)$\leq 1.1$. If this molar ratio is outside the range, some of the resins are left unreacted, which can interfere with the properties of cured products and hence, adversely affect the performance of semiconductor devices sealed therewith.

In the resin composition of the invention, a curing accelerator is preferably used.

Any desired curing accelerator may be used insofar as it can accelerate curing reaction of the silicone-modified epoxy resin and epoxy resin with the silicone-modified phenolic resin and phenolic resin. For example, one or more compounds selected from among imidazole compounds, tertiary amine compounds and organophosphorus compounds may be used as the curing accelerator. Of these, organophosphorus compounds are preferred for moisture-proof reliability.

Examples of suitable imidazole compounds include 2-methylimidazole, 2-ethylimidazole, 4-methylimidazole, 4-ethylimidazole, 2-phenylimidazole, 2-phenyl-4-methylimidazole, 2-phenyl-4-hydroxymethylimidazole, 2-ethyl-4-methylimidazole, 1-cyanoethyl-2-methylimidazole, 2-phenyl-4-methyl-5-hydroxymethylimidazole, and 2-phenyl-4,5-dihydroxymethylimidazole.

Suitable tertiary amine compounds include amine compounds having alkyl or aralkyl substituents bonded to the nitrogen atom, such as triethylamine, benzyldimethylamine, benzyltrimethylamine and a-methylbenzyldimethylamine; cycloamidine compounds or organic acid salts thereof, such as 1,8-diazabicyclo[5.4.0]undec-7-ene and its phenol, octanoic acid and oleic acid salts; and salts or complex salts of cycloamidine compounds with quaternary boron compounds, such as the compound of the following formula.

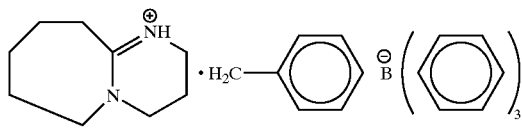

Suitable organophosphorus compounds include triorganophosphines such as triphenylphosphine, tributylphosphine, tri(p-methylphenyl)phosphine, tri(nonylphenyl)phosphine and triphenylphosphine triphenylborane; and quaternary phosphonium salts such as tetraphenylphosphonium tetraphenylborate.

An appropriate amount of the curing accelerator added is up to 10 parts (0 to 10 parts), desirably 0.1 to 10 parts, more desirably 0.5 to 5 parts by weight, per 100 parts by weight of the entire organic resin components (i.e., silicone-modified epoxy resin, silicone-modified phenolic resin and optional epoxy resin and/or phenolic resin to be described later, together). With less than 0.1 part by weight of the curing accelerator, the resin composition may become under-cured. More than 10 parts by weight of the curing accelerator may detract from the storage stability of the resin composition.

Depending on a particular application, inorganic fillers such as silica, alumina, talc, mica, silicon nitride, boron nitride and silver, flame retardants, ion trapping agents, wax, colorants, adhesive aids and the like may be added to the resin composition of the invention insofar as they do not compromise the objects of the invention.

The resin composition of the invention can be obtained by mixing the respective components in a well-known manner. For example, the silicone-modified epoxy resin, the silicone-modified phenolic resin, and optionally, the epoxy resin, phenolic resin, curing accelerator, inorganic filler and other components are simultaneously or separately agitated, dissolved, mixed and dispersed while heating them if necessary. The means for mixing these components may be a mixer if the resin composition is pasty, or a roll mill or extruder if the resin composition is solid. The order of mixing and other conditions including time, temperature, and pressure may be properly selected so as to obtain the desired resin composition.

The viscosity of the resin composition is not critical and may be properly set, depending on a particular application, in a wide range covering from solid to liquid at room temperature. In particular, liquid resin compositions preferably have a viscosity of 10 to 1,000 Pass at 25° C.

The inventive resin composition is advantageously used in coating and sealing surfaces of semiconductor chips. Although the type of semiconductor device is not critical, the resin composition is useful in the application of bonding hard chips to flexible substrates such as chip on board (COB) and chip on flex (COF).

Conventional methods and conditions may be used in coating and sealing surfaces of semiconductor chips with the inventive resin composition. Preferred heat curing conditions include 80 to 200° C. and 30 to 300 minutes.

For the resin composition of the invention, it is requisite that the organopolysiloxane component do not form a phase separation structure in the cured product, that is, the cured product be uniform. Whether or not the organopolysiloxane component is uniform in the cured product is judged by its outer appearance. The cured product is uniform if it looks clear and non-uniform if it looks opaque.

The inventive resin composition cures into a product having significantly improved flexibility and impact resistance without detracting from adherence, heat resistance and humidity resistance inherent to conventional well-known semiconductor-encapsulating resin compositions. At the bonding interface between parts having noticeably different mechanical and thermal behaviors, the resin composition can fully absorb and alleviate the stresses induced therebetween.

EXAMPLE

Synthesis Examples, Examples and Comparative Examples are given below for illustrating the invention. The invention is not limited to the following Examples.

Synthesis of Silicone-Modified Resins

All silicone-modified epoxy resins (Compounds A to F) and silicone-modified phenolic resins (Compounds G to L) obtained in Synthesis Examples 1 to 12 below are addition reaction products resulting from hydrosilylation addition reaction between silicon atom-bonded hydrogen atoms (SiH groups) in the organohydrogenpolysiloxane and aromatic ring-bonded alkenyl groups (typically allyl groups) in the epoxy resin or phenolic resin.

Synthesis Example 1

A flask equipped with an agitating blade, dropping funnel, thermometer, ester adapter and reflux condenser was charged with 42.0 g (0.10 mol) of an epoxy resin of the following formula (8) and 168.0 g of toluene, followed by azeotropic dehydration at 130° C. for 2 hours. The solution was cooled to 100° C. whereupon 0.5 g of a catalyst CAT-PL-50T (Shin-Etsu Chemical Co., Ltd.) was added dropwise. Immediately thereafter, a mixture of 36.3 g (0.05 mol) of an organopolysiloxane of the following formula (14) and 145.2 g of toluene was added dropwise over about 30 minutes, and the reaction solution was aged at 100° C. for 6 hours. The toluene was removed from the reaction solution, yielding a yellow clear liquid ($\eta$=5 Pa·s at 25° C., epoxy equivalent 400, organopolysiloxane content 46.4 wt %). This is designated Compound A.

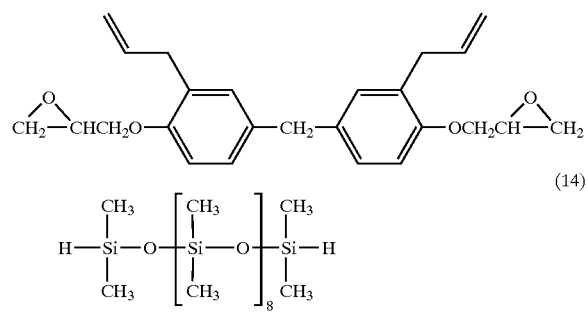

Synthesis Example 2

A flask equipped with an agitating blade, dropping funnel, thermometer, ester adapter and reflux condenser was charged with 42.0 g (0.10 mol) of an epoxy resin of the above formula (8) and 168.0 g of toluene, followed by azeotropic dehydration at 130° C. for 2 hours. The solution was cooled to 100° C. whereupon 0.5 g of a catalyst CAT-PL-50T (Shin-Etsu Chemical Co., Ltd.) was added dropwise. Immediately thereafter, a mixture of 110.3 g (0.05 mol) of an organopolysiloxane of the following formula (15) and 441.2 g of toluene was added dropwise over about 30 minutes, and the reaction solution was aged at 100° C. for 6 hours. The toluene was removed from the reaction solution, yielding a yellow clear liquid ($\eta$=2 Pa·s at 25° C., epoxy equivalent 770, organopolysiloxane content 72.4 wt %). This is designated Compound B.

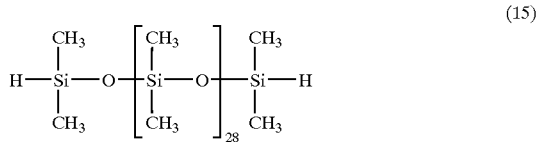

Synthesis Example 3

A flask equipped with an agitating blade, dropping funnel, thermometer, ester adapter and reflux condenser was charged with 42.0 g (0.10 mol) of an epoxy resin of the above formula (8) and 168.0 g of toluene, followed by azeotropic dehydration at 130° C. for 2 hours. The solution was cooled to 100° C. whereupon 0.5 g of a catalyst CAT-PL-50T (Shin-Etsu Chemical Co., Ltd.) was added dropwise. Immediately thereafter, a mixture of 221.3 g (0.05 mol) of an organopolysiloxane of the following formula (16) and 885.2 g of toluene was added dropwise over about 30 minutes, and the reaction solution was aged at 100° C. for 6 hours. The toluene was removed from the reaction solution, yielding a yellow opaque liquid ($\eta$=1 Pa·s at 25° C., epoxy equivalent 770, organopolysiloxane content 84.0 wt %). This is designated Compound C.

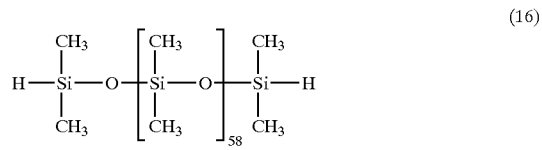

Synthesis Example 4

A flask equipped with an agitating blade, dropping funnel, thermometer, ester adapter and reflux condenser was charged with 42.0 g (0.10 mol) of an epoxy resin of the above formula (8) and 168.0 g of toluene, followed by azeotropic dehydration at 130° C. for 2 hours. The solution was cooled to 100° C. whereupon 0.5 g of a catalyst CAT-PL-50T (Shin-Etsu Chemical Co., Ltd.) was added dropwise. Immediately thereafter, a mixture of 122.9 g (0.05 mol) of an organopolysiloxane of the following formula (17) and 491.6 g of toluene was added dropwise over about 30 minutes, and the reaction solution was aged at 100° C. for 6 hours. The toluene was removed from the reaction solution, yielding a yellow clear liquid ($\eta$=4 Pa·s at 25° C., epoxy equivalent 830, organopolysiloxane content 74.5 wt %). This is designated Compound D.

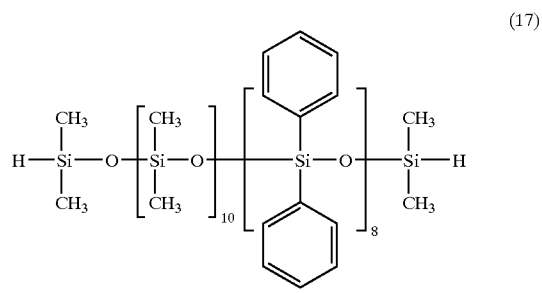

Synthesis Example 5

A flask equipped with an agitating blade, dropping funnel, thermometer, ester adapter and reflux condenser was charged with 37.8 g (0.10 mol) of an epoxy resin of the following formula (9) and 151.2 g of toluene, followed by azeotropic dehydration at 130° C. for 2 hours. The solution was cooled to 100° C. whereupon 0.5 g of a catalyst CAT-PL-50T (Shin-Etsu Chemical Co., Ltd.) was added dropwise. Immediately thereafter, a mixture of 36.3 g (0.05 mol) of an organopolysiloxane of the above formula (14) and 145.2 g of toluene was added dropwise over about 30 minutes, and the reaction solution was aged at 100° C. for 6 hours. The toluene was removed from the reaction solution, yielding a yellow clear liquid ($\eta$=3 Pa·s at 25° C., epoxy equivalent 370, organopolysiloxane content 49.0 wt %). This is designated Compound E.

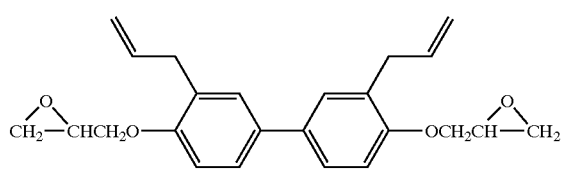

(9)

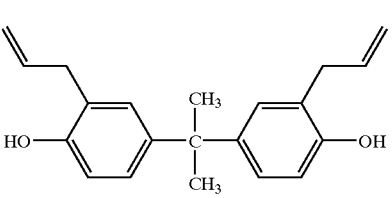

(11)

This is designated Compound G.

Synthesis Example 6

A flask equipped with an agitating blade, dropping funnel, thermometer, ester adapter and reflux condenser was charged with 58.0 g (0.10 mol) of an epoxy resin of the following formula (10) and 232.0 g of toluene, followed by azeotropic dehydration at 130° C. for 2 hours. The solution was cooled to 100° C. whereupon 0.5 g of a catalyst CAT-PL-50T (Shin-Etsu Chemical Co., Ltd.) was added dropwise. Immediately thereafter, a mixture of 110.3 g (0.05 mol) of an organopolysiloxane of the above formula (15) and 441.2 g of toluene was added dropwise over about 30 minutes, and the reaction solution was aged at 100° C. for 6 hours. The toluene was removed from the reaction solution, yielding a yellow clear liquid ($\eta$=5 Pa·s at 25° C., epoxy equivalent 850, organopolysiloxane content 65.5 wt %). This is designated Compound F.

Synthesis Example 8

A flask equipped with an agitating blade, dropping funnel, thermometer, ester adapter and reflux condenser was charged with 30.8 g (0.10 mol) of a phenolic resin of the above formula (11) and 123.2 g of toluene, followed by azeotropic dehydration at 130° C. for 2 hours. The solution was cooled to 100° C. whereupon 0.5 g of a catalyst CAT-PL-50T (Shin-Etsu Chemical Co., Ltd.) was added dropwise. Immediately thereafter, a mixture of 110.3 g (0.05 mol) of an organopolysiloxane of the above formula (15) and 441.2 g of toluene was added dropwise over about 30 minutes, and the reaction solution was aged at 100° C. for 6 hours. The toluene was removed from the reaction solution, yielding a brown clear liquid ($\eta$=10 Pa·s at 25° C., phenol equivalent 720, organopolysiloxane content 78.2 wt %). This is designated Compound H.

Synthesis Example 9

A flask equipped with an agitating blade, dropping funnel, thermometer, ester adapter and reflux condenser was charged with 30.8 g (0.10 mol) of a phenolic resin of the above formula (11) and 123.2 g of toluene, followed by azeotropic dehydration at 130° C. for 2 hours. The solution was cooled to 100° C. whereupon 0.5 g of a catalyst CAT-PL-50T (Shin-Etsu Chemical Co., Ltd.) was added dropwise. Immediately thereafter, a mixture of 221.3 g (0.05 mol) of an organopolysiloxane of the above formula (16) and 885.2 g of toluene was added dropwise over about 30 minutes, and the reaction solution was aged at 100° C. for 6 hours. The toluene was removed from the reaction solution, yielding a brown opaque liquid ($\eta$=6 Pa·s at 25° C., phenol equivalent 720, organopolysiloxane content 87.8 wt %). This is designated Compound I.

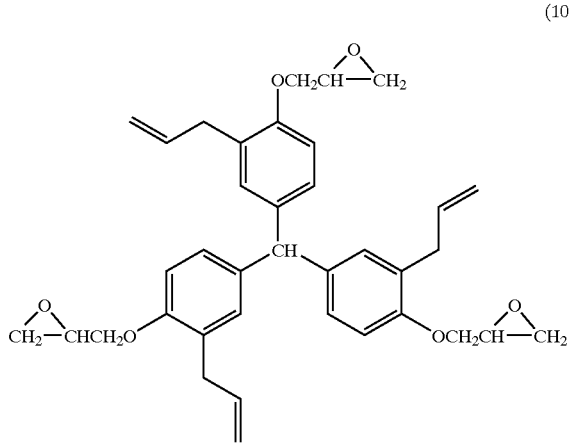

(10)

Synthesis Example 7

A flask equipped with an agitating blade, dropping funnel, thermometer, ester adapter and reflux condenser was charged with 30.8 g (0.10 mol) of a phenolic resin of the following formula (11) and 123.2 g of toluene, followed by azeotropic dehydration at 130° C. for 2 hours. The solution was cooled to 100° C. whereupon 0.5 g of a catalyst CAT-PL-50T (Shin-Etsu Chemical Co., Ltd.) was added dropwise. Immediately thereafter, a mixture of 36.3 g (0.05 mol) of an organopolysiloxane of the above formula (14) and 145.2 g of toluene was added dropwise over about 30 minutes, and the reaction solution was aged at 100° C. for 6 hours. The toluene was removed from the reaction solution, yielding a brown clear liquid ($\eta$=20 Pa·s at 25° C., phenol equivalent 340, organopolysiloxane content 54.1 wt %).

Synthesis Example 10

A flask equipped with an agitating blade, dropping funnel, thermometer, ester adapter and reflux condenser was charged with 30.8 g (0.10 mol) of a phenolic resin of the above formula (11) and 123.2 g of toluene, followed by azeotropic dehydration at 130° C. for 2 hours. The solution was cooled to 100° C. whereupon 0.5 g of a catalyst CAT-PL-50T (Shin-Etsu Chemical Co., Ltd.) was added dropwise. Immediately thereafter, a mixture of 122.9 g (0.05 mol) of an organopolysiloxane of the above formula (17) and 491.6 g of toluene was added dropwise over about 30 minutes, and the reaction solution was aged at 100° C. for 6 hours. The toluene was removed from the reaction solution, yielding a brown clear liquid ($\eta$=16 Pa·s at 25° C., phenol equivalent 770, organopolysiloxane content 80.0 wt %). This is designated Compound J.

Synthesis Example 11

A flask equipped with an agitating blade, dropping funnel, thermometer, ester adapter and reflux condenser was charged with 26.6 g (0.10 mol) of a phenolic resin of the following formula (12) and 106.4 g of toluene, followed by azeotropic dehydration at 130° C. for 2 hours. The solution was cooled to 100° C. whereupon 0.5 g of a catalyst CAT-PL-50T (Shin-Etsu Chemical Co., Ltd.) was added dropwise. Immediately thereafter, a mixture of 36.3 g (0.05 mol) of an organopolysiloxane of the above formula (14) and 145.2 g of toluene was added dropwise over about 30 minutes, and the reaction solution was aged at 100° C. for 6 hours. The toluene was removed from the reaction solution, yielding a brown clear liquid (η=12 Pa·s at 25° C., phenol equivalent 315, organopolysiloxane content 58.1 wt %). This is designated Compound K.

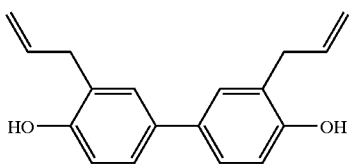
(12)

Synthesis Example 12

A flask equipped with an agitating blade, dropping funnel, thermometer, ester adapter and reflux condenser was charged with 41.2 g (0.10 mol) of a phenolic resin of the following formula (13) and 164.8 g of toluene, followed by azeotropic dehydration at 130° C. for 2 hours. The solution was cooled to 100° C. whereupon 0.5 g of a catalyst CAT-PL-50T (Shin-Etsu Chemical Co., Ltd.) was added dropwise. Immediately thereafter, a mixture of 110.3 g (0.05 mol) of an organopolysiloxane of the above formula (15) and 441.2 g of toluene was added dropwise over about 30 minutes, and the reaction solution was aged at 100° C. for 6 hours. The toluene was removed from the reaction solution, yielding a brown clear liquid (η=20 Pa·s at 25° C., phenol equivalent 760, organopolysiloxane content 72.8 wt %). This is designated Compound L.

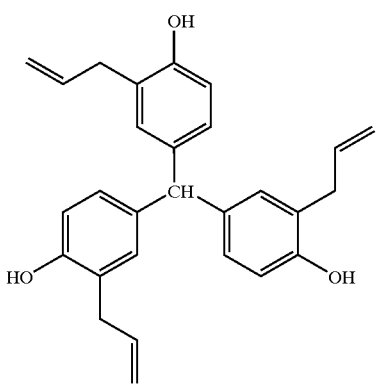
(13)

Preparation of Resin Compositions

Examples 1–7 and Comparative Examples 1–3

Resin compositions of Examples 1–7 and Comparative Examples 1–3 were prepared by blending Compound A, B, C, D, E, F, G, H, I, J, K or L, synthesized above, bisphenol A type epoxy resin M (η=15 Pa·s at 25° C., epoxy equivalent 180), a phenol novolac resin N (softening point 55° C., phenol equivalent 100), triphenylphosphine (TPP), silica (spherical fused silica, average particle size 2 μm, maximum particle diameter 10 μm), carbon black and a silane coupling agent KBM-403 (Shin-Etsu Chemical Co., Ltd., γ-glycidoxypropyltrimethoxysilane) in accordance with the formulation shown in Table 1 and mixing them in a mixer. The following tests (a) to (f) were carried out on these resin compositions, with the results being shown in Table 1. It is noted that the content of organopolysiloxane is calculated from its amount used in Synthesis Example, and curing conditions are 150° C. and 4 hours in all examples.

(a) Outer appearance of cured product

A film sample of 1 mm thick was formed using a composition of the formulation shown in Table 1 from which silica, carbon black and KBM-403 were omitted, and its outer appearance was visually observed. A clear specimen indicates that the composition does not form a phase separation structure and is uniform whereas an opaque specimen indicates that the composition forms a phase separation structure.

(b) Glass transition temperature of cured product

Using a sample of 5 mm×5 mm×15 mm formed from the composition, the glass transition temperature (Tg) was measured with a thermomechanical analyzer at a heating rate of 5° C./min.

(c) Water absorption of cured product

A sample having a diameter of 50 mm and a thickness of 3 mm formed from the composition was held at 121° C., RH 100% and 2 atm. for 72 hours. A weight change before and after the test was determined.

(d) Tensile modulus of cured product

Flexural modulus at 25° C. was measured according to JIS K 7113.

(e) Moisture-proof reliability

Semiconductor devices were prepared by sealing 14-pin DIP (aluminum-wired silicon chip on Alloy 42 frame with gold wire interconnections) with the resin compositions in Table 1. Twenty semiconductor devices were held at 121° C., RH 100%, 2 atm. for 100 hours, 300 hours, or 1000 hours. The number of packages showing abnormalities due to wire breakage is reported per the total number of test packages.

(f) Thermal cycling

Samples were prepared by applying the resin compositions of Table 1 to BT substrates and UPILEX (Ube Kosan Co., Ltd., 50 μm thick) to form a coating of 8 mm×8 mm×50 μm, mounting silicon chips of 7 mm×7 mm×0.3 mm thereon, and curing the resin compositions. Twenty samples were subjected to a thermal cycling test between 240° C. solder bath/10 seconds and liquefied nitrogen/10 seconds. The test was repeated 10 cycles, 30 cycles or 10 0 cycles. The number of cracked or peeled samples after the test is reported per the total number of test samples.

TABLE 1

| Components (pbw) | Example 1 | Example 2 | Example 3 | Example 4 | Example 5 | Example 6 | Example 7 | Comparative Example 1 | Comparative Example 2 | Comparative Example 3 |
|---|---|---|---|---|---|---|---|---|---|---|
| Compound A | 54.1 | 0 | 0 | 0 | 0 | 30.8 | 13.4 | 5.0 | 0 | 35.7 |
| Compound B | 0 | 51.7 | 0 | 0 | 0 | 0 | 0 | 0 | 0 | 0 |
| Compound C | 0 | 0 | 0 | 0 | 0 | 0 | 0 | 0 | 69.4 | 0 |
| Compound D | 0 | 0 | 51.9 | 0 | 0 | 0 | 0 | 0 | 0 | 0 |
| Compound E | 0 | 0 | 0 | 54.0 | 0 | 0 | 0 | 0 | 0 | 0 |
| Compound F | 0 | 0 | 0 | 0 | 52.8 | 0 | 0 | 0 | 0 | 0 |
| Compound G | 45.9 | 0 | 0 | 0 | 0 | 26.2 | 11.4 | 4.2 | 30.6 | 0 |
| Compound H | 0 | 48.3 | 0 | 0 | 0 | 0 | 0 | 0 | 0 | 0 |
| Compound I | 0 | 0 | 0 | 0 | 0 | 0 | 0 | 0 | 0 | 64.3 |
| Compound J | 0 | 0 | 48.1 | 0 | 0 | 0 | 0 | 0 | 0 | 0 |
| Compound K | 0 | 0 | 0 | 46.0 | 0 | 0 | 0 | 0 | 0 | 0 |
| Compound L | 0 | 0 | 0 | 0 | 47.2 | 0 | 0 | 0 | 0 | 0 |
| Epoxy resin M | 0 | 0 | 0 | 0 | 0 | 24.6 | 48.4 | 58.4 | 0 | 0 |
| Phenolic resin N | 0 | 0 | 0 | 0 | 0 | 18.4 | 26.8 | 32.4 | 0 | 0 |
| TPP | 1 | 1 | 1 | 1 | 1 | 1 | 1 | 1 | 1 | 1 |
| Silica | 233 | 233 | 233 | 233 | 233 | 233 | 233 | 233 | 233 | 233 |
| Carbon black | 1 | 1 | 1 | 1 | 1 | 1 | 1 | 1 | 1 | 1 |
| KBM-403 | 1 | 1 | 1 | 1 | 1 | 1 | 1 | 1 | 1 | 1 |
| Organopolysiloxane content (wt %) based on entire organic resin components | 49.9 | 75.2 | 77.2 | 53.0 | 69.0 | 27.4 | 12.4 | 4.6 | 74.9 | 73.0 |
| (a) Outer appearance of cured product | clear | clear | clear | clear | clear | clear | clear | opaque | opaque | opaque |
| (b) Tg (°C.) | 0 | −35 | −5 | −10 | −18 | 22 | 53 | 86 | −40 | −36 |
| (c) Water absorption (%) | 0.33 | 0.18 | 0.12 | 0.27 | 0.25 | 0.45 | 0.59 | 0.72 | 0.82 | 0.75 |
| (d) Tensile modulus (MPa) | 30 | 12 | 28 | 24 | 19 | 130 | 440 | 1700 | 5 | 6 |
| (e) Moisture-proof reliability 100 hr | 0/20 | 0/20 | 0/20 | 0/20 | 0/20 | 0/20 | 0/20 | 0/20 | 1/20 | 1/20 |
| 300 hr | 0/20 | 0/20 | 0/20 | 0/20 | 0/20 | 0/20 | 0/20 | 0/20 | 12/20 | 10/20 |
| 1000 hr | 0/20 | 0/20 | 0/20 | 0/20 | 0/20 | 0/20 | 0/20 | 2/20 | 20/20 | 20/20 |
| (f) Thermal cycling 10 cycles | 0/20 | 0/20 | 0/20 | 0/20 | 0/20 | 0/20 | 0/20 | 5/20 | 0/20 | 0/20 |
| 30 cycles | 0/20 | 0/20 | 0/20 | 0/20 | 0/20 | 0/20 | 0/20 | 12/20 | 0/20 | 0/20 |
| 100 cycles | 0/20 | 0/20 | 0/20 | 0/20 | 0/20 | 0/20 | 0/20 | 20/20 | 1/20 | 2/20 |

There has been described a resin composition comprising a silicone-modified epoxy or phenolic resin which cures into a product having both the adherence, heat resistance and humidity resistance characteristic of epoxy resins or phenolic resins and the flexibility and impact resistance characteristic of silicone resins. When semiconductor devices are coated or sealed with the cured resin composition, the resin composition can fully absorb and alleviate the stresses induced at the bonding interface between parts having noticeably different mechanical and thermal behaviors.

Japanese Patent Application No. 2001-048285 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A resin composition comprising a silicone-modified phenolic resin obtained by reacting a phenolic resin having in a molecule at least two structural units of the following formula (1):

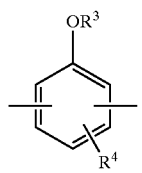

(1)

wherein $R^3$ is hydrogen and $R^4$ is hydrogen or a monovalent hydrocarbon group having 1 to 6 carbon atoms, with an organopolysiloxane having the following average compositional formula (2):

$$(R^1)_a(R^2)_b SiO_{(4-a-b)/2} \quad (2)$$

wherein $R^1$ is selected from the class consisting of a hydrogen atom, a hydroxyl group, an alkoxy group, an alkenyloxy group, and a monovalent organic group containing an amino, epoxy, hydroxyl or carboxyl group, $R^2$ is a substituted or unsubstituted monovalent hydrocarbon group, letters a and b are positive numbers satisfying $0.001 \leq a \leq 1$, $1 \leq b \leq 2.5$ and $1 \leq a+b \leq 3$, the number of silicon atoms in a molecule is an integer of 2 to 1,000, and the number of functional groups $R^1$ directly attached to silicon atoms in a molecule is an integer of at least 1, said modified phenolic resin being such that after said modified phenolic resin is cured alone to form a cured product or after said modified phenolic resin is added to another phenolic resin and cured together to form a cured product, the organopolysiloxane component does not form a phase separation structure in the cured product.

2. The resin composition of claim 1 wherein the organopolysiloxane component accounts for up to 80% by weight of said modified phenolic resin and at least 10% by weight based on entire organic resins in the composition.

3. The resin composition of claim 1 wherein said phenolic resin having in a molecule at least two structural units of the formula (1) is represented by the following general formula (3), (4) or (5):

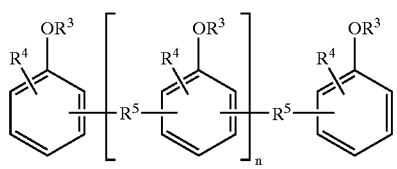

(3)

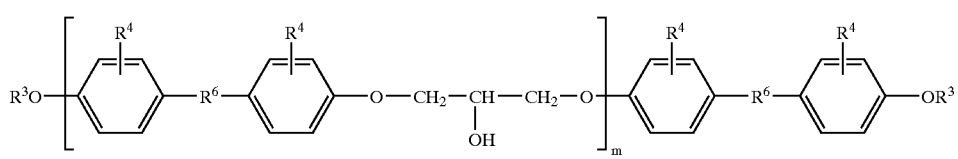

(4)

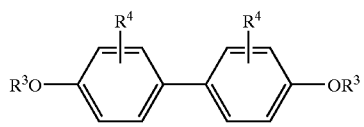

(5)

wherein $R^3$ is hydrogen, $R^4$ is hydrogen or a monovalent hydrocarbon group having 1 to 6 carbon atoms, $R^5$ is —CH$_2$— or

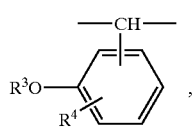

$R^6$ is

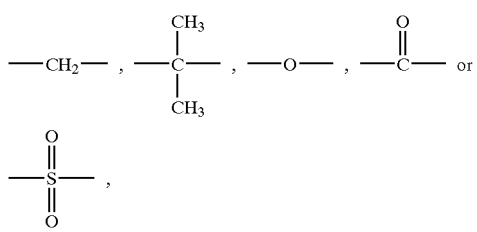

letters n and m are integers inclusive of 0.

4. A semiconductor device comprising a semiconductor chip whose surface is coated or sealed with a cured product of the resin composition of claim 1.

5. A resin composition comprising a silicone-modified epoxy resin obtained by reacting an epoxy resin having in a molecule at least two structural units of the following formula (1):

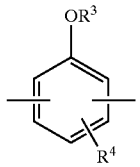

(1)

wherein $R^3$ is glycidyl and $R^4$ is hydrogen or a monovalent hydrocarbon group having 1 to 6 carbon atoms, with an organopolysiloxane having the following average compositional formula (2):

$$(R^1)_a(R^2)_b SiO_{(4-a-b)/2}$$ (2)

wherein $R^1$ is selected from the class consisting of a hydrogen atom, a hydroxyl group, an alkoxy group, an alkenyloxy group, and a monovalent organic group containing an amino, epoxy, or hydroxyl, $R^2$ is a substituted or unsubstituted monovalent hydrocarbon group, letters a and b are positive numbers satisfying $0.001 \leq a \leq 1$, $1 \leq b \leq 2.5$ and $1 \leq a+b \leq 3$, the number of silicon atoms in a molecule is an integer of 2 to 1,000, and the number of functional groups $R^1$ directly attached to silicon atoms in a molecule is an integer of at least 1, said modified epoxy resin being such that after said modified epoxy resin is cured alone to form a cured product or after said modified epoxy resin is added to another epoxy resin and cured together to form a cured product, the organopolysiloxane component does not form a phase separation structure in the cured product.

6. The resin composition of claim 5 wherein the organopolysiloxane component accounts for up to 80% by weight of said modified epoxy resin and at least 10% by weight based on entire organic resins in the composition.

7. The resin composition of claim 5 wherein said epoxy resin having in a molecule at least two structural units of the formula (1) is represented by the following general formula (3), (4) or (5):

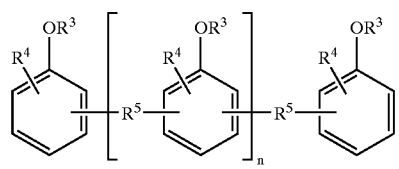

(3)

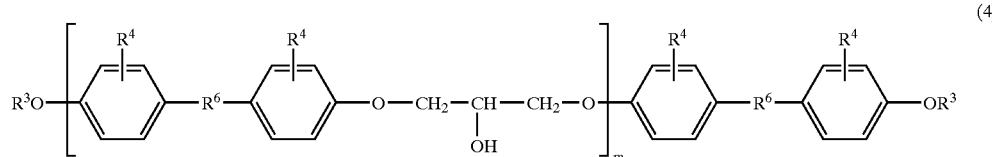

(4)

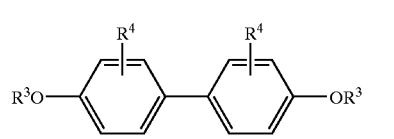

(5)

wherein $R^3$ is glycidyl, $R^4$ is hydrogen or a monovalent hydrocarbon group having 1 to 6 carbon atoms, $R^5$ is —CH$_2$— or

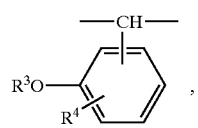

, $R^6$ is

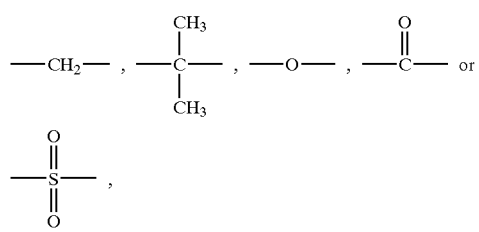

letters n and m are integers inclusive of 0.

8. A semiconductor device comprising a semiconductor chip whose surface is coated or sealed with a cured product of the resin composition of claim 5.

9. A resin composition comprising a silicone-modified epoxy resin obtained by reacting an epoxy resin having in a molecule at least two structural units of the following formula (1):

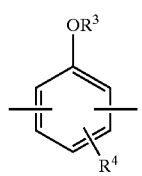

(1)

wherein $R^3$ is glycidyl and $R^4$ is hydrogen or a monovalent hydrocarbon group having 1 to 6 carbon atoms, with an organopolysiloxane having the following average compositional formula (2):

$$(R^1)_a(R^2)_b SiO_{(4-a-b)/2}$$ (2)

wherein $R^1$ is selected from the class consisting of a hydrogen atom, a hydroxyl group, an alkoxy group, an alkenyloxy group, and a monovalent organic group containing an amino, epoxy, hydroxyl or carboxyl group, $R^2$ is a substituted or unsubstituted monovalent hydrocarbon group, letters a and b are positive numbers satisfying $0.001 \leq a \leq 1$, $1 \leq b \leq 2.5$ and $1 \leq a+b \leq 3$, the number of silicon atoms in a molecule is an integer of 2 to 1,000, and the number of functional groups $R^1$ directly attached to silicon atoms in a molecule is an integer of at least 1, and a silicone-modified phenolic resin obtained by reacting a phenolic resin having in a molecule at least two structural units of the following formula (1):

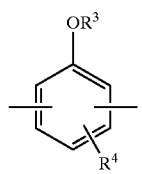

(1)

wherein $R^3$ is hydrogen and $R^4$ is hydrogen or a monovalent hydrocarbon group having 1 to 6 carbon atoms, with an organopolysiloxane having the following average compositional formula (2):

$$(R^1)_a(R^2)_b SiO_{(4-a-b)/2} \quad (2)$$

wherein $R^1$ is selected from the class consisting of a hydrogen atom, a hydroxyl group, an alkoxy group, an alkenyloxy group, and a monovalent organic group containing an amino, epoxy, hydroxyl or carboxyl group, $R^2$ is a substituted or unsubstituted monovalent hydrocarbon group, letters a and b are positive numbers satisfying $0.001 \leq a \leq 1$, $1 \leq b \leq 2.5$ and $1 \leq a+b \leq 3$, the number of silicon atoms in a molecule is an integer of 2 to 1,000, and the number of functional groups $R^1$ directly attached to silicon atoms in a molecule is an integer of at least 1, said modified epoxy and phenolic resin being such that after said modified epoxy or phenolic resin is cured alone to form a cured product or after said modified epoxy or phenolic resin is added to another epoxy resin and/or phenolic resin and cured together to form a cured product, the organopolysiloxane component does not form a phase separation structure in the cured product.

10. The resin composition of claim 9 wherein the organopolysiloxane component accounts for up to 80% by weight of said modified epoxy or phenolic resin and at least 10% by weight based on entire organic resins in the composition.

11. The resin composition of claim 9 wherein said epoxy resin or phenolic resin having in a molecule at least two structural units of the formula (1) is represented by the following general formula (3), (4) or (5):

wherein $R^3$ is hydrogen or glycidyl, $R^4$ is hydrogen or a monovalent hydrocarbon group having 1 to 6 carbon atoms, $R^5$ is —$CH_2$— or

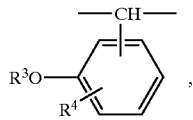

$R^6$ is

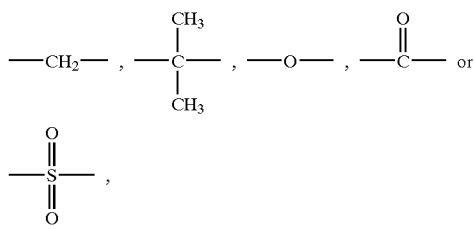

letters n and m are integers inclusive of 0.

12. A semiconductor device comprising a semiconductor chip whose surface is coated or sealed with a cured product of the resin composition of claim 9.

13. The resin composition of claim 1, 5 or 9 wherein said organopolysiloxane has a molecular weight of 500 to 5,000.

14. The resin composition of claim 1, 5 or 9 wherein another epoxy resin selected from the group consisting of bisphenol-type epoxy resins, novolac-type epoxy resins, (3)

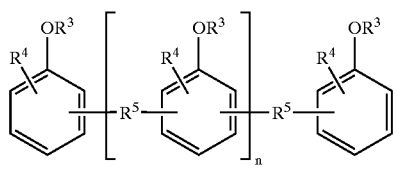

(4)

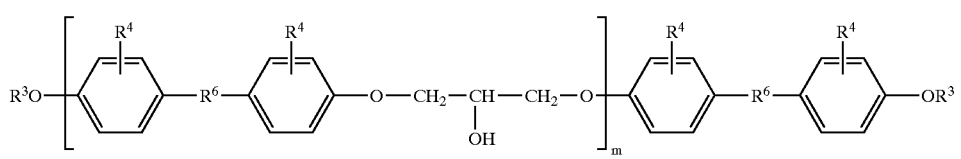

(5)

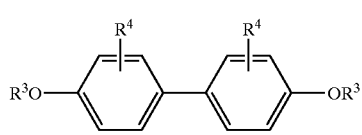

triphenolalkane-type epoxy resins, epoxy resins having a biphenyl skeleton, epoxy resins having a naphthalene skeleton, dicyclopentadiene-phenol novolac resins, phenolaralkyl type epoxy resins, glycidyl ester type epoxy resins, alicyclic epoxy resins, heterocyclic epoxy resins, and halogenated epoxy resins, and/or another phenolic resin selected from the group consisting of bisphenol type resins, novolac resins, triphenolalkane type resins, resole type phenolic resins, phenol aralkyl resins, biphenyl type phenolic resins, naphthalene type phenolic resins, and cyclopentadiene type phenolic resins is blended in addition to the silicone-modified resin.

15. The resin composition of claim 1, 5 or 9 wherein a curing accelerator selected from the group consisting of imidazole compounds, tertiary amine compounds and organophosphorus compounds is blended with said silicone-modified resin.

* * * * *